(12) United States Patent
Murata et al.

(10) Patent No.: US 11,943,545 B2
(45) Date of Patent: Mar. 26, 2024

(54) IMAGE PROCESSING DEVICE (71) Applicant: OLYMPUS CORPORATION, Hachioji (JP)

(72) Inventors: Yutaka Murata, Tokyo (JP); Yoshinobu Tanaka, Tokyo (JP); Atsushi Ishihara, Tokyo (JP); Akira Ueno, Tokyo (JP)

(73) Assignee: OLYMPUS CORPORATION, Tokyo (JP)

( * ) Notice: Subject to any disclaimer, the term of this patent is extended or adjusted under 35 U.S.C. 154(b) by 519 days.

(21) Appl. No.: 17/164,961

(22) Filed: Feb. 2, 2021

(65) Prior Publication Data
US 2021/0160425 A1    May 27, 2021

Related U.S. Application Data (63) Continuation of application No. PCT/JP2018/029572, filed on Aug. 7, 2018.

(51) Int. Cl.
*H04N 23/80* (2023.01)
*G11C 11/413* (2006.01)

(52) U.S. Cl.
CPC ........... *H04N 23/80* (2023.01); *G11C 11/413* (2013.01)

(58) Field of Classification Search
CPC ........ H04N 23/80; H04N 23/65; H04N 23/81; H04N 5/21; G11C 11/413; G06F 12/06
See application file for complete search history.

(56) References Cited

U.S. PATENT DOCUMENTS

| | | | | |
|---|---|---|---|---|
| 2005/0268130 A1* | 12/2005 | Naruse | ...................... | G06F 1/24 713/322 |
| 2006/0050305 A1* | 3/2006 | Tokuyama | ........... | H04N 5/2628 358/1.15 |
| 2010/0214441 A1* | 8/2010 | Yanada | .................... | H04N 5/77 348/231.2 |
| 2019/0278503 A1* | 9/2019 | Jayachandran | ......... | G06F 1/305 |

FOREIGN PATENT DOCUMENTS

| | | |
|---|---|---|
| JP | 10-161600 A | 6/1998 |
| JP | 2006-80627 A | 3/2006 |
| JP | 2006-352621 A | 12/2006 |
| JP | 2008-300948 A | 12/2008 |

OTHER PUBLICATIONS

International Search Report dated Oct. 23, 2018, issued in counterpart International Application No. PCT/JP2018/029572, with English translation (4 pages).

\* cited by examiner

*Primary Examiner* — Timothy J Henn
(74) *Attorney, Agent, or Firm* — WHDA, LLP (57) ABSTRACT

An image processing device includes: a circuit block in which an operation period is predetermined and intermittent operation is performed according to the operation period; a plurality of SRAMs; and a dummy control circuit configured to increase an intensity of a dummy operation of an unused SRAM among the plurality of SRAMs for a certain period of time before the operation period of the circuit block, and to decrease the intensity of the dummy operation of the unused SRAM among the plurality of SRAMs for a certain period of time after the operation period of the circuit block.

4 Claims, 7 Drawing Sheets

IMAGE PROCESSING DEVICE

CROSS REFERENCE TO RELATED APPLICATIONS

This application is a continuation application based on a PCT Patent Application No. PCT/JP2018/029572, filed on Aug. 7, 2018, the entire content of which is hereby incorporated by reference.

BACKGROUND

Technical Field

The present invention relates to an image processing device.

Background Art

In an image processing device, a huge circuit block (imaging block) in an ASIC (Application Specific Integrated Circuit) consumes a current of several hundred mA (milliampere) in normal operation. In a huge circuit block, from the viewpoint of suppressing power consumption, it is common practice to stop the circuit during a period of non-operation, that is, to perform intermittent operation. In the imaging block of the image processing device, the control circuit stops the clock during the horizontal blanking period or vertical blanking period (ineffective period of video data) outside the control area of the control signal of the imaging element so that the arithmetic circuit does not operate.

Figure 6:
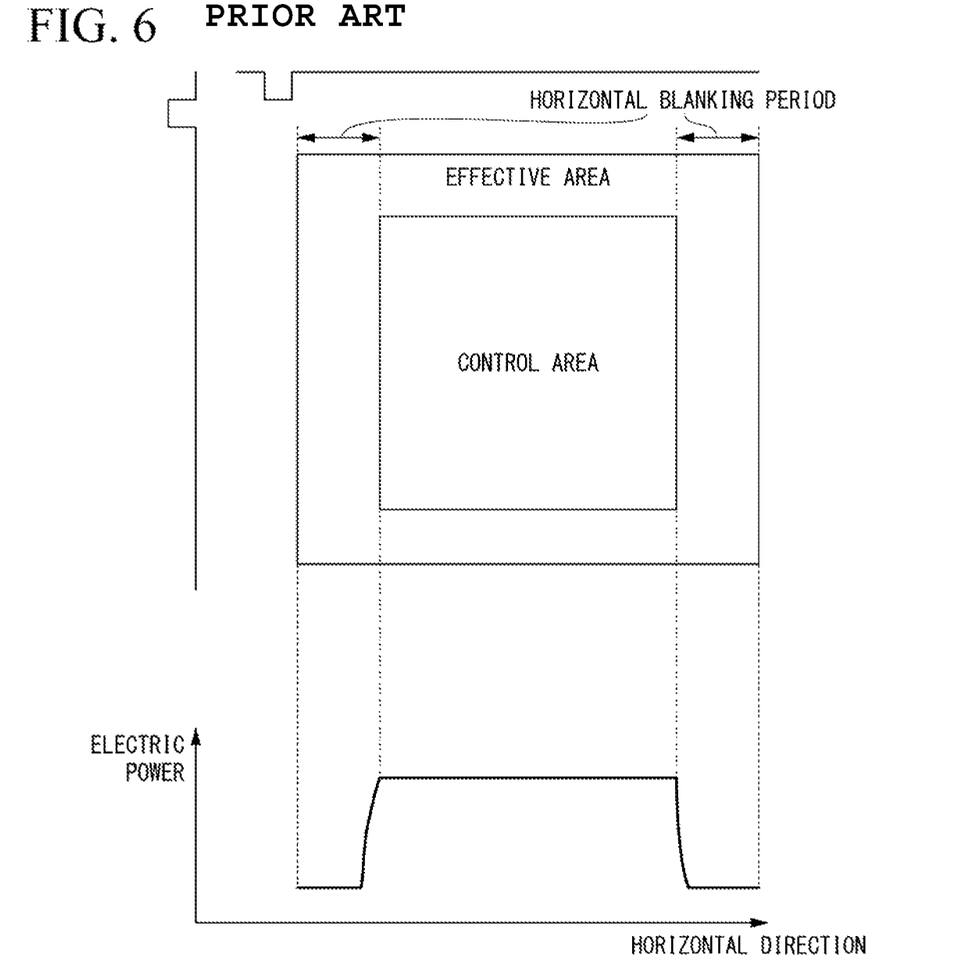
FIG. 6 is a diagram showing a relationship between an effective area and a control area and a voltage fluctuation in an imaging block of an image processing device according to a conventional technique.

FIG. 6 is a diagram showing the relationship between the effective area and the control area and the voltage fluctuation in the imaging block of the image processing device. As shown in FIG. 6, a two-dimensional image (effective area) is read horizontally from left to right by raster scanning, which is repeated moving from top to bottom, thereby reading the image. When the reading position enters the control area of the control signal of the imaging element, the control circuit activates (inputs) the clock to operate the arithmetic circuit (performs arithmetic processing). When the reading position enters the horizontal blanking period or the vertical blanking period before and after the control area, the control circuit stops the clock or the arithmetic control so that the arithmetic circuit does not operate.

As shown in the voltage fluctuation of FIG. 6, in the imaging block, when the control area in which the arithmetic circuit is operating and the horizontal blanking period or the vertical blanking period in which the arithmetic circuit is not operating are switched, the current consumption of several hundred mA changes instantly, so that the operating power suddenly changes and the power supply current fluctuates. That is, in the case where the huge circuit block performs intermittent operation with a certain periodicity as described above, a sudden change in the power supply current occurs at the start and stop of the operation. Such sudden fluctuations in the power supply current cause unstable operation of the circuit and deterioration of characteristics.

Figure 7:
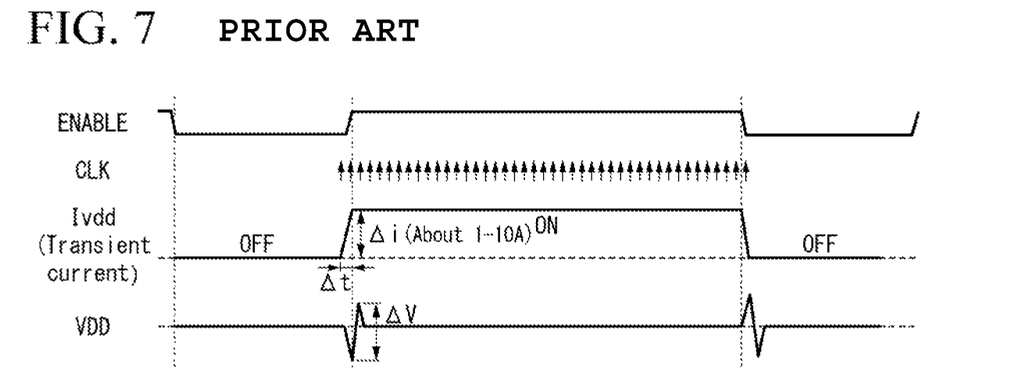
FIG. 7 is a timing chart showing an example of voltage fluctuation of an arithmetic circuit in an image processing device according to a conventional technique.

FIG. 7 is a diagram showing an example of voltage fluctuation of an arithmetic circuit in a huge circuit block (imaging block) at the start of operation (when switching from the state where circuit is stopped (OFF) to the state where circuit is operated (ON)) and at the end of operation (when switching from the state where circuit is operated (ON) to the state where circuit is stopped (OFF)). The ENABLE signal indicates ON and OFF of the circuit. In the control area (effective period), the circuit operates (ON) by inputting the clock CLK. In the horizontal blanking period or the vertical blanking period (ineffective period), the circuit is stopped (OFF) by stopping (not inputting) the clock CLK or stopping the arithmetic control by turning off the ENABLE signal.

As shown in FIG. 7, the transient current Ivdd changes abruptly when switching from the state where circuit is stopped (OFF) to the state where circuit is operated (ON). That is, since the difference $\Delta i$ between the current flowing when ON and the current flowing when OFF changes during the short time $\Delta t$, the slope of the transient current Ivddd is steep. When the transient current Ivdd flows with a steep gradient, voltage fluctuation is caused by the impedance component of the power supply wiring or the package. The fluctuation range of the power supply voltage VDD is $\Delta V$.

The power supply voltage is determined for each arithmetic circuit (LSI), and the operating range is determined in the range of ±several % of it. Therefore, if $\Delta V$ is too large, the LSI will enter an area where it does not be activated. The same phenomenon occurs when switching from the state where circuit is operated (ON) to the state where circuit is stopped (OFF). That is, the power supply voltage fluctuates greatly when switching from the ineffective period to the effective period.

Figure 8:
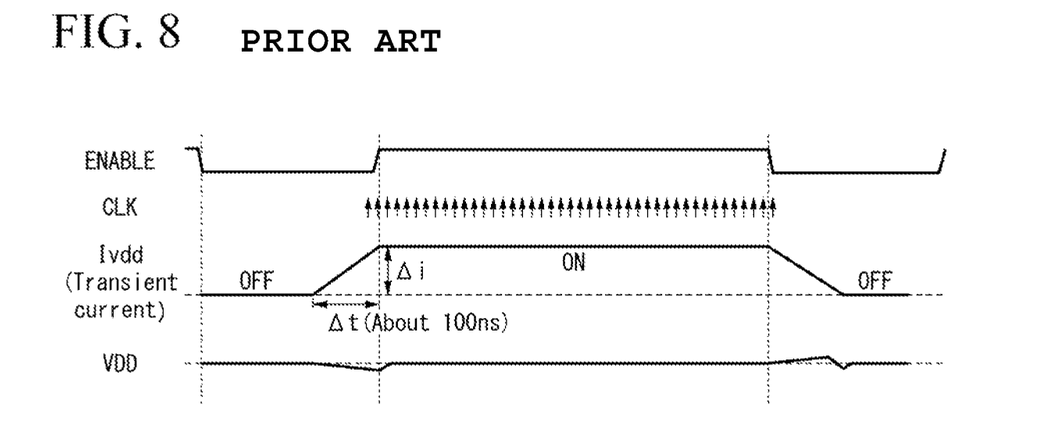
FIG. 8 is a timing chart showing an example of voltage fluctuation of an arithmetic circuit when a problem of the prior art is solved.

In order to solve the above-mentioned problem, since the height (magnitude) $\Delta i$ of the current change is fixed, it is sufficient to increase $\Delta t$ to moderate the current change. As a result, the voltage fluctuation accompanying the current change can be suppressed and the voltage level can be stabilized. FIG. 8 is a diagram showing an example of voltage fluctuation of the arithmetic circuit at the time when switching from the state where circuit is stopped to the state where circuit is operated and the state where circuit is operated to the state where circuit is stopped when the above problem is solved. As shown in FIG. 8, when $\Delta t$ is lengthened (in the example of this description, it is set to about 100 ns), the current change becomes gradual, whereby the voltage fluctuation due to the current change can be suppressed and the power supply voltage can be stabilized.

As described above, when the clock CLK is started to be supplied to each circuit module of the large-scale block all at once, the current supply capacity cannot follow the rapid increase in current consumption with the low-voltage power supply, and there is a risk of significant undershoot in the power supply voltage. In addition, when the clock supply to each circuit module is suddenly stopped, a voltage overshoot that exceeds the rating occurs, and this causes unstable operation of the circuit (low voltage operation) and deterioration of characteristics due to sudden current changes.

From the above viewpoint, it is conceivable to perform a dummy operation using a dummy pattern to flatten the current fluctuation in order not to cause a current fluctuation when performing an intermittent operation in the active signal area and other area. Japanese Unexamined Patent Application, First Publication No. 2006-80627 (hereinafter referred to as Patent Document 1) discloses a configuration in which dummy processing is performed during an ineffective period to flatten current fluctuations in order to suppress power fluctuations.

Figure 9:
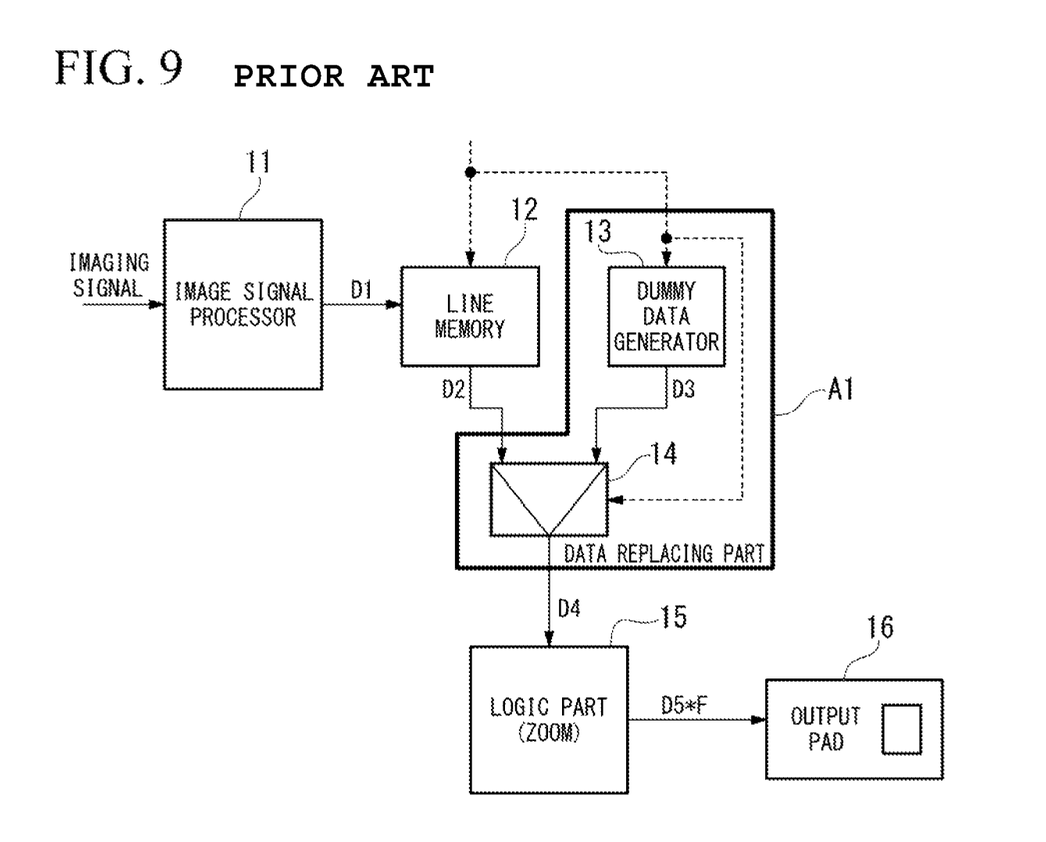
FIG. 9 is a block diagram showing a configuration of a video signal processing circuit according to a conventional technique.

FIG. 9 is a block diagram showing a configuration of a video signal processing circuit disclosed in Patent Document 1. The video signal processing part 11 generates video data D1 based on the imaging signal from the imaging element. The line memory 12 temporarily stores the video data D1 from the video signal processing part 11 for each line, and outputs the effective/ineffective video data D2 while switching between effective and ineffective.

The data replacement part A1 is composed of a dummy data generation part 13 and a selector 14, and replaces the video data in the ineffective period with dummy data at the input or output of the logic part 15. The dummy data generation part 13 generates and outputs different dummy data D3 for each ineffective line. The selector 14 selects either the video data D2 from the line memory 12 or the dummy data D3 from the dummy data generation part 13. When the effective line is detected, the video data D2 from the line memory 12 is selected, while when the ineffective line is detected, the dummy data D3 from the dummy data generation part 13 is selected.

The logic part 15 takes in the selection data D4 from the selector 14, performs predetermined digital processing such as zoom processing, adds the effective/ineffective identification flag F to the obtained digitally processed video data D5, and outputs the data D5. The output pad 16 is an interface with an external monitor or the like, and outputs the digitally processed video data D5 from the logic part 15 together with the effective/ineffective identification flag F. With such a configuration, in Patent Document 1, power consumption fluctuations are suppressed and power fluctuations are flattened.

According to the configuration disclosed in Patent Document 1, in the intermittent operation, dummy data is input to the subsequent circuit to perform a constant operation to keep the operating current constant, so that the circuit does not stop. That is, since both the effective period and the ineffective period of the video data perform normal operation, it is disadvantageous from the viewpoint of low power consumption.

SUMMARY

The present invention provides an image processing device capable of reducing power consumption by relaxing the fluctuation of the power supply current by intentionally performing a dummy operation on the unused SRAM before and after the intermittent operation (at the time of starting and stopping the operation).

An image processing device includes: a circuit block in which an operation period is predetermined and intermittent operation is performed according to the operation period; a plurality of SRAMs; and a dummy control circuit configured to increase an intensity of a dummy operation of an unused SRAM among the plurality of SRAMs for a certain period of time before the operation period of the circuit block, and to decrease the intensity of the dummy operation of the unused SRAM among the plurality of SRAMs for a certain period of time after the operation period of the circuit block.

The dummy control circuit may further include: an imaging element; and an imaging interface part configured to read out image data from the imaging element and to generate an imaging signal. The circuit block may be an imaging processing part that reads out the imaging signal from the imaging interface part to perform image processing, and the dummy control circuit may cause an unused SRAM among the SRAMs to perform the dummy operation in a horizontal blanking period or a vertical blanking period before or after a control area of a control signal of the imaging element.

The image processing device may further include a mode switching part configured to change a timing of causing the SRAM to perform the dummy operation.

The image processing device may further include an intensity switching part configured to switch the intensity of the dummy operation by changing the number of SRAMs in which the dummy operation is performed or a control signal of the SRAM.

According to the image processing device according to each aspect of the present invention, the power supply current fluctuation is moderated by intentionally performing a dummy operation on the unused SRAM before and after the intermittent operation (at the time of starting and stopping the operation). Thereby, it is possible to provide an image processing device that enables low power consumption.

DETAILED DESCRIPTION OF THE PREFERRED EMBODIMENTS

The present invention focuses on a circuit that starts to be activated all at once according to a synchronization signal. In the following description of the embodiment of the present invention, an imaging part (imaging block) that receives data from an imaging element will be described, but the same technique is applicable to a display part that is activated in synchronization with a display device such as a television or a liquid crystal panel. That is, the present invention includes the contents of the display part. That is, in the following description, the input data from the imaging element will be used as an example, but the same technique can be applied to the output data to the display device.

Figure 1:
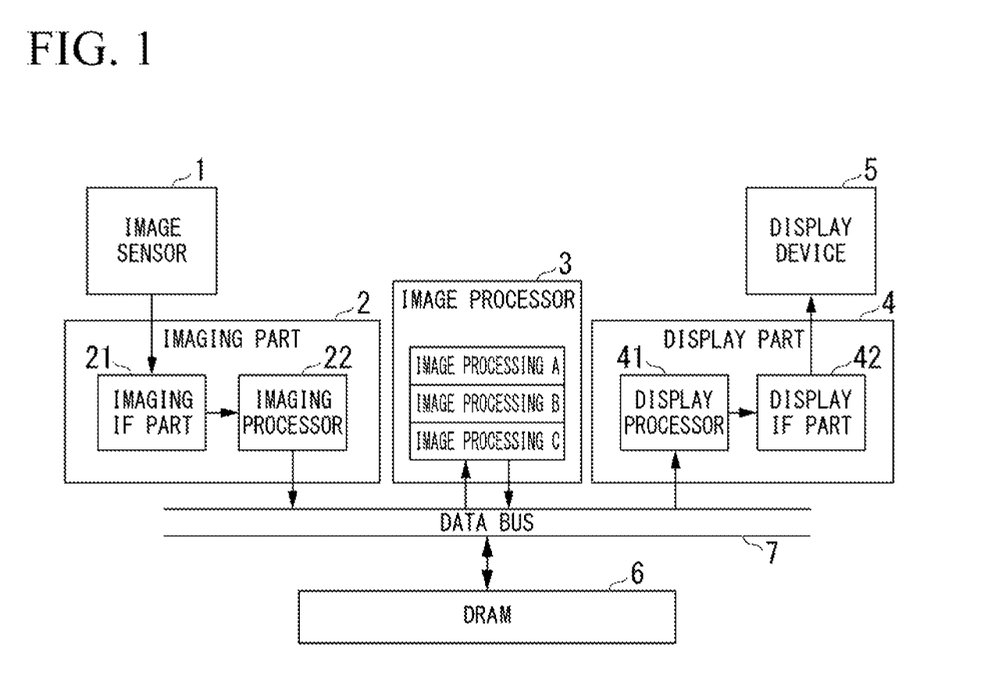
FIG. 1 is a block diagram showing a configuration of an image processing device according to an embodiment of the present invention.

FIG. 1 is a block diagram showing an example of the overall configuration of the image processing device according to the embodiment of the present invention. The image processing device includes an image sensor (imaging element) 1, an imaging part (imaging block) 2, an image processing part 3, a display part 4, a display device 5, a DRAM 6, and a data bus 7. The imaging part 2 includes an imaging interface part (imaging IF part) 21 and an imaging processing part 22. The display part 4 includes a display processing part 41 and a display interface part (display IF part) 42.

The imaging part 2 operates by receiving input data (image signal) from the imaging element 1. The imaging IF part 21 reads out the data (image signal) obtained by the imaging element 1 and generates an imaging signal. The image processing part 22 processes the image image signal from the imaging IF part 21 and transmits it to the image processing part 3 via the data bus 7. The image processing part 3 performs image processing A, B, C, or the like on the data (image processed data) from the imaging part 2. The data image-processed by the image processing part 3 is transmitted to the display processing part 41 via the data bus 7, processed, and transmitted to the display device 5 via the display part IF part 42.

Figure 2:
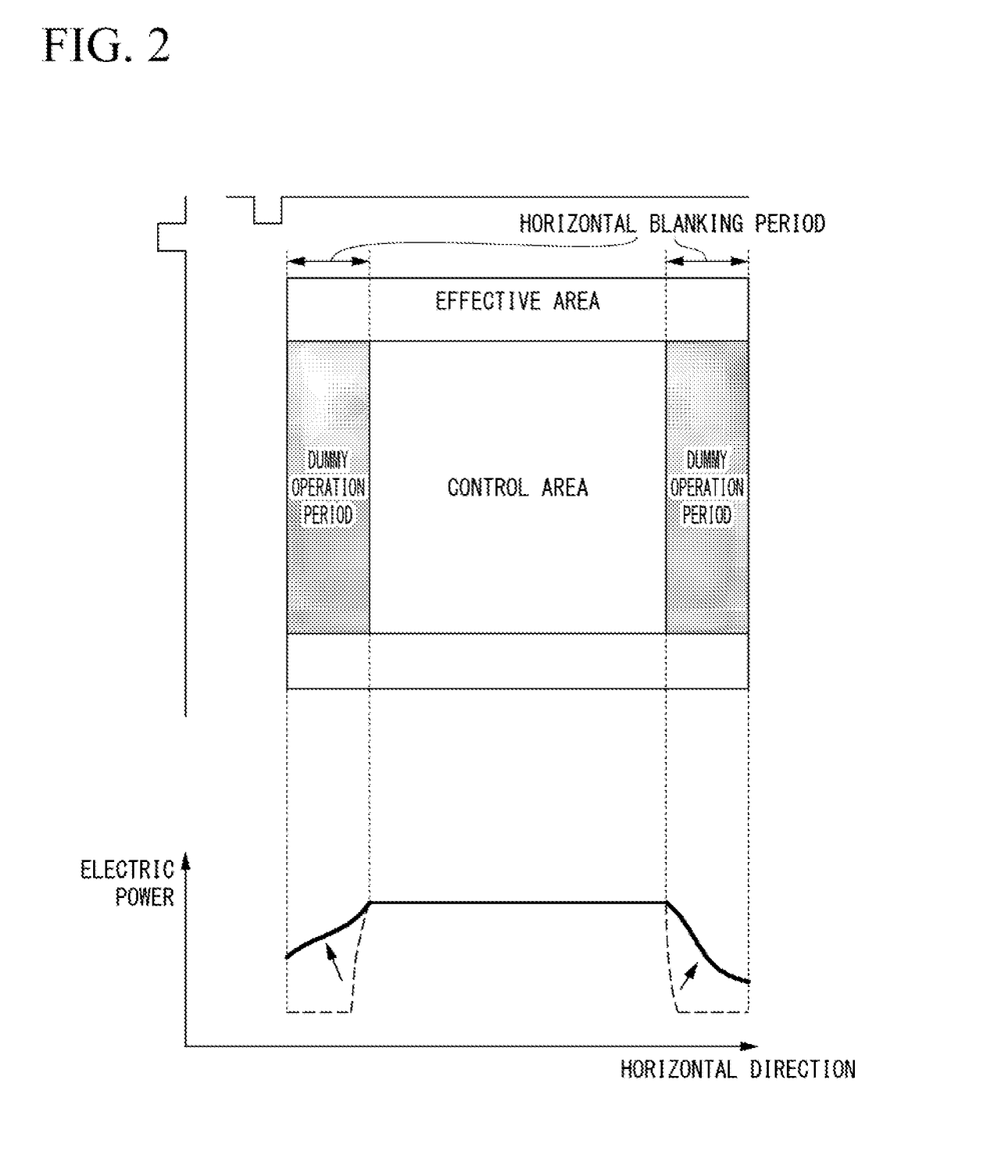
FIG. 2 is a diagram showing a relationship between an effective area and a control area and a voltage fluctuation in an imaging block of an image processing device according to the embodiment of the present invention.

FIG. 2 is a diagram showing the relationship between the effective area and the control area and the voltage fluctuation in the imaging block of the image processing device according to the embodiment of the present invention. As shown in FIG. 2, a two-dimensional image (effective area) is read in the horizontal direction from left to right by raster scanning, which is repeated by moving from top to bottom so that the image is read. When the reading position enters the control area of the control signal of the imaging element, the control circuit normally operates the arithmetic circuit (performs arithmetic processing). The dummy operation period described below is when the reading position enters the horizontal blanking period before and after the control area. As shown in the voltage fluctuation of FIG. 2, a sudden change in the operating power is suppressed during the dummy operation period, whereby the power supply current fluctuation can be suppressed.

In the above description, in the imaging block of the image processing device, an example in which the horizontal blanking period before or after the control area of the control signal of the imaging element is the dummy operation period has been described. However, the vertical blanking period before or after the control area of the control signal of the imaging element may be the dummy operation period. Further, the present invention can be applied to other than the imaging block of the image processing device, in which case, the circuit block may be any circuit block in which the operation period is predetermined and the operation is intermittently performed according to the operation period.

Figure 3:
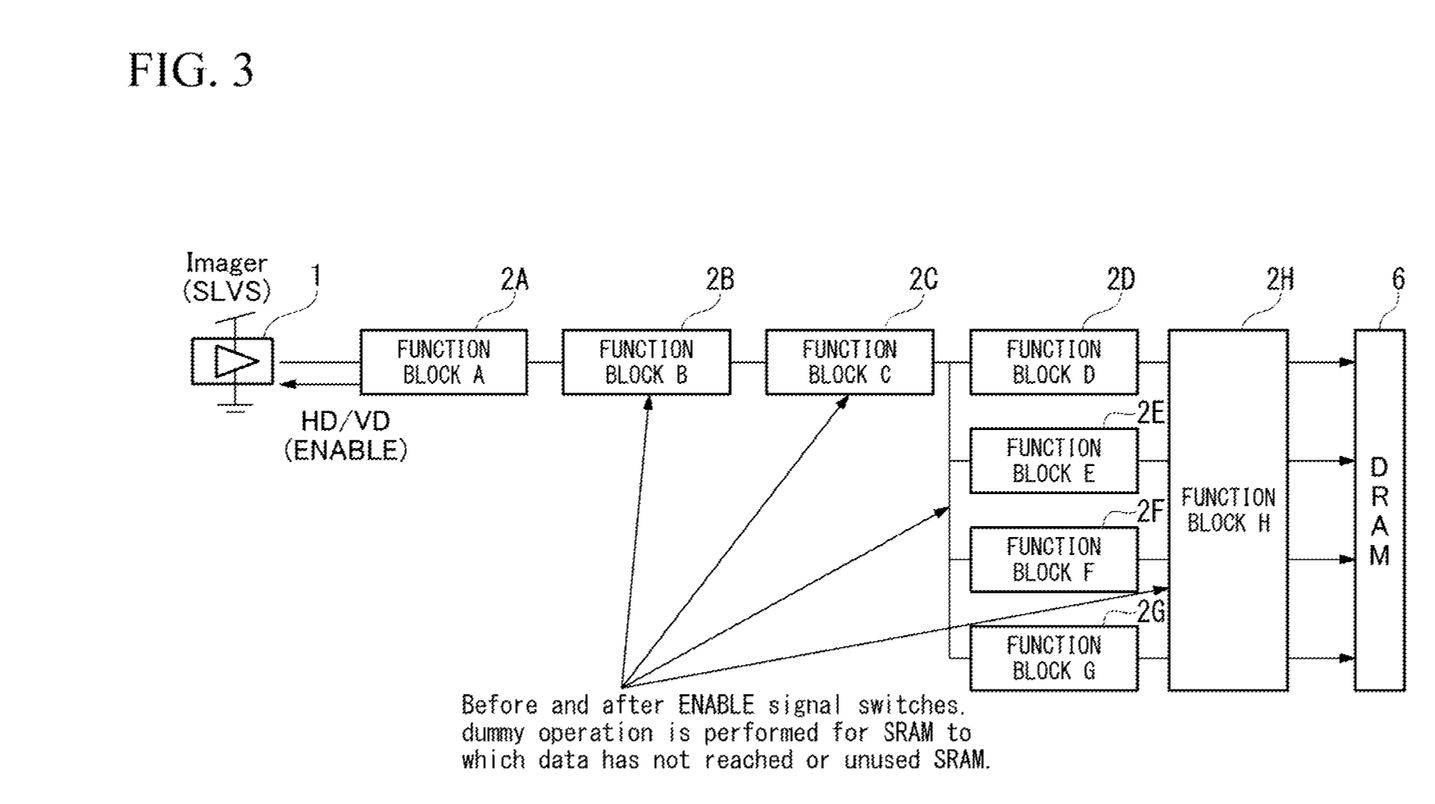
FIG. 3 is a diagram showing a functional block in an imaging block of an image processing device according to the embodiment of the present invention.

FIG. 3 is a diagram showing a functional block in an imaging block (giant circuit block) of the image processing device according to the embodiment of the present invention. As shown in FIG. 3, the imaging block (imaging part) is configured by combining various functional blocks divided for each function. In the example of FIG. 3, functional blocks A to H (2A to 2H) are present. The image signal from the imaging element 1 is processed by each functional block in the imaging block and finally transmitted to the DRAM 6.

There are many SRAMs in each functional block, but not all SRAMs are running (used). There are multiple fractional blocks in the huge circuit block, but unused SRAM (non-functional SRAM or non-working SRAM because data has not arrived yet) exists in these functional blocks. That is, in the huge circuit block, there are functional blocks separated for each function, and when a certain function (functional block) is not used, the SRAM in the functional block is unused and can be freely used. Therefore, these unused SRAMs are used to control power consumption and realize gradual fluctuation of operating power.

Figure 4:
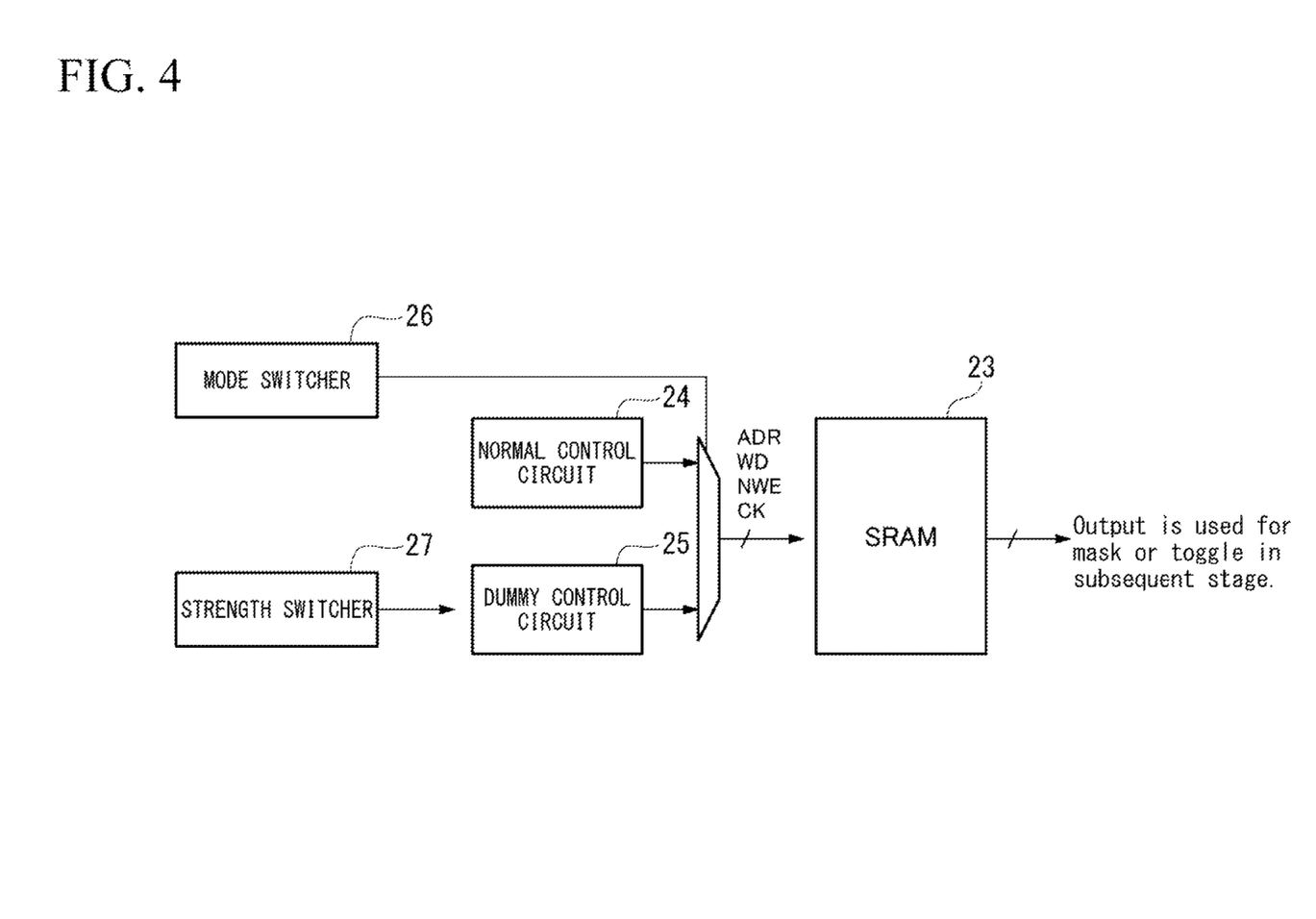
FIG. 4 is a diagram for explaining the control of SRAM in each functional block in the imaging block of the image processing device according to the embodiment of the present invention.

FIG. 4 is a diagram for explaining the control of SRAM in each functional block in the imaging block of the image processing device according to the embodiment of the present invention. As shown in FIG. 4, the SRAM 23 is controlled by the normal control circuit 24 or the dummy control circuit 25. The normal control circuit 24 causes the SRAM 23 to operate normally. The dummy control circuit 25 causes the SRAM 23 to perform a dummy operation. As described above, as a control circuit for operating the SRAM 23, a dummy control circuit 25 is provided separately from the normal control circuit 24.

As the control signal of the SRAM 23, a general one can be used. Specifically, the control signal includes each control signal of the address ADR, the data WD to be written, the write enable NWD, and the clock CK.

The mode switching part 26 switches the operation mode (normal operation, dummy operation) of the SRAM 23 by selecting the normal control circuit 24 and the dummy control circuit 25. That is, the mode switching part 26 can change the timing of dummy operation of the SRAM 23. At the start of operation, the control of the SRAM 23 is switched from the dummy control circuit 25 to the normal control circuit 24, and the operation is started slowly. At the time of stop, the control of the SRAM 23 is switched from the normal control circuit 24 to the dummy control circuit 25, and the operation is stopped gently.

The strength switching part 27 switches the strength of the dummy operation of the SRAM 23, that is, whether the dummy operation is strengthened or weakened. The strength of the dummy operation corresponds to the magnitude of power consumption and the strength of rising (gradient) in the SRAM 23. To change the intensity of the dummy operation, the number of SRAMs to be dummy-operated or the control signal of the SRAM is changed. The control signal is a signal that controls one or more of an address, data, an enable signal, a clock, and the like. That is, the amount of power consumed by the SRAM is adjusted (switched) by the address, data, enable signal, clock, and the like.

By switching the strength of the dummy operation (power consumption of SRAM), the fluctuation of the power supply voltage is adjusted so as to draw a gentle curve. For example, the strength of the dummy operation can be changed by changing the number of SRAMs to be operated as a dummy. Also, by changing the frequency of access to (one or more) SRAM(s), the operating speed of the SRAM can be changed and the intensity of the dummy operation can be changed. Specifically, the power consumption (power) of the SRAM can be changed by inputting the address signal of the SRAM and the data to be written (for example, the toggled data) one after another, or by changing the cycle of the enable signal. By changing the address signal of the SRAM, the address of the SRAM to be read or written can be changed, and the strength of the dummy operation can be changed.

Figure 5:
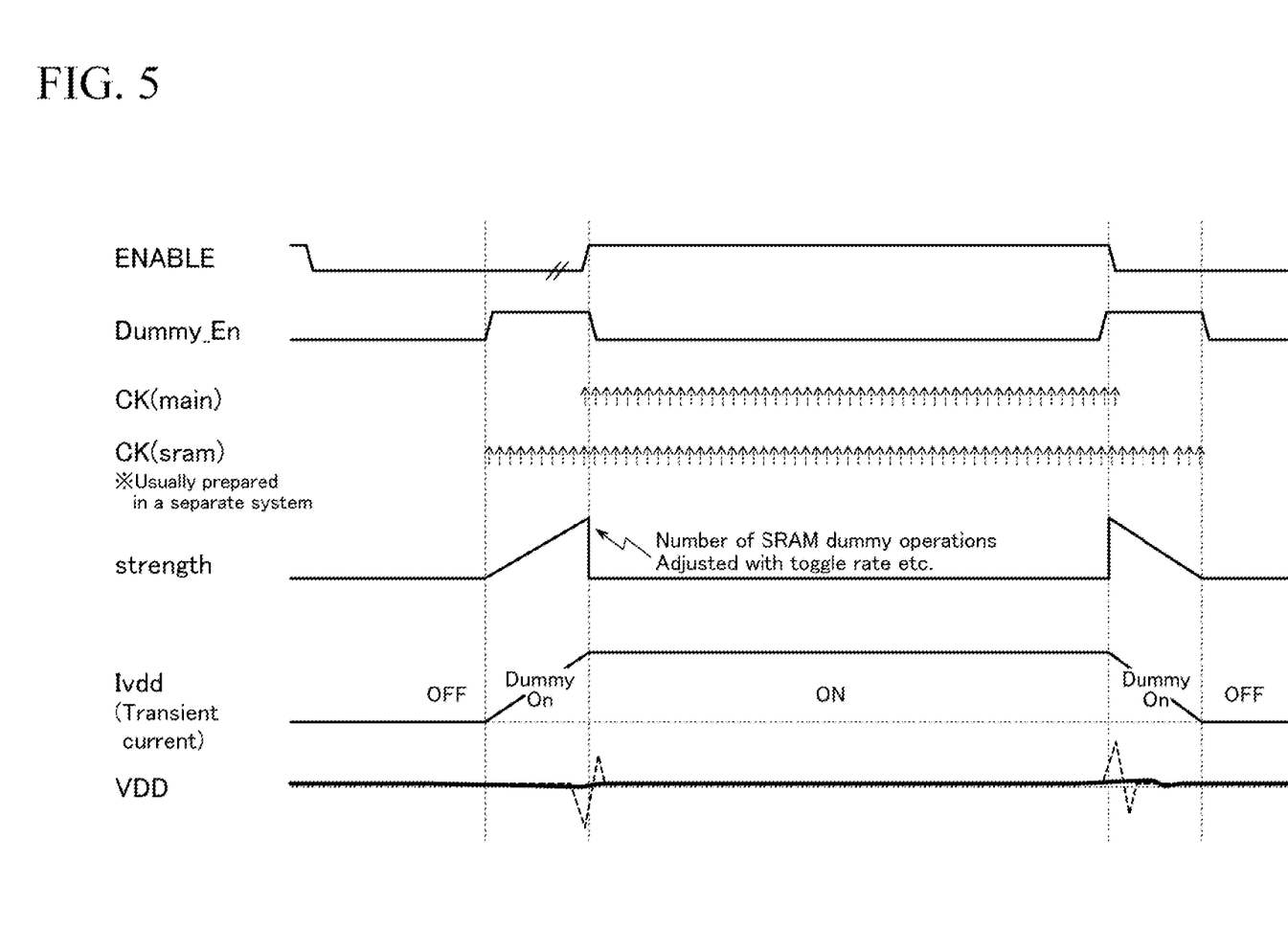
FIG. 5 is a timing chart showing the relationship between each control signal, dummy operation, and voltage fluctuation in the imaging block of the image processing device according to the embodiment of the present invention.

FIG. 5 is a timing chart showing the relationship between each control signal, dummy operation, and voltage fluctuation in the imaging block of the image processing device according to the embodiment of the present invention. When the ENABLF signal is turned on, it operates normally, and when it is turned of it stops. A clock (CK (main)) for normal operation is input in accordance with this. The dummy ENABLE signal (Dummy_En) is turned on before and after the normal operation period to perform a dummy operation. Further, a clock for dummy operation (CK (sram)) is prepared in a system different from the clock for normal operation (CK (main)).

"Strength" in FIG. 5 indicates the strength of the dummy operation. When the dummy operation is turned on before the normal operation period, the strength of the dummy operation is gradually increased by changing the number of SRAMs that perform dummy operations and the number of toggles that are input to the SRAMs. Then, when the normal operation period is entered, the strength of the dummy operation is reduced. Similarly, when the dummy operation is turned on after the normal operation period, the strength of the dummy operation is gradually weakened by changing the number of SRAMs that perform dummy operations and the number of toggles that are input to the SRAMs.

"Ivdd" in FIG. 5 indicates a transient current. Before the normal operation period, the transient current rises as the dummy operation turns ON, and the normal state is reached. Then, after the normal operation period, the transient current drops from the normal state as the dummy operation turns ON. By gradually changing the transient current before and after the normal operation period in this way, it is possible to suppress a sudden fluctuation of VDD (power supply voltage fluctuation).

As described above, in the present invention, in the intermittent operation, the unused SRAM is subjected to a dummy operation, and the power consumption is gradually changed to stop or start. This makes it possible to reduce power consumption during intermittent operation. That is, in order to suppress power fluctuations by using an unused SRAM, a place different from the normally used path main path is intentionally activated. Since SRAM is used, control and output masking are easy. In addition, the area increase can be suppressed by using SRAM-Bist (built-in test circuit).

Although the input data from the imaging element to the imaging part in the image processing device has been described above as an example, the same technique can be applied to the output data from the display part to the display device. In this case, the above-described embodiment is applied to the huge arithmetic circuit in the display processing part 41 to perform a dummy operation.

The image processing device according to the embodiment of the present invention includes a circuit block having a plurality of circuits, an SRAM provided in the circuit, and a dummy control circuit. The operation period of the circuit block is predetermined, and the circuit performs intermittent operation according to (synchronously) the operation period. The dummy control circuit dummy-operates the unused SRAM before or after the operation period of the circuit block.

Here, the circuit block may refer to the entire imaging block, or may refer to one or more functional blocks within the imaging block.

The SRAM to be operated as a dummy is not limited to the SRAM in the same circuit block, and may be an SRAM in the same chip using the same power supply.

In the present invention, an unused SRAM may be subjected to an intentional dummy operation before or after the intermittent operation (at the time of starting or stopping the operation).

In addition, the mode switching part can change the timing at which the SRAM is operated as a dummy. Further, the intensity switching part can switch the intensity of the dummy operation and adjust the magnitude of the power consumption of the SRAM by changing the number of SRAMs operated by the dummy or the control signal of the SRAM.

The present invention is not limited to the image processing device and the display device in the imaging device, and can be applied to any device having a circuit that operates in synchronization with the synchronization signal.

Although one embodiment of the present invention has been described above, the technical scope of the present invention is not limited to the above-described embodiment. The combination of components can be changed, various changes can be made to each component, and the components can be deleted without departing from the scope of the present invention.

Each component is for explaining the function and processing related to each component. One configuration (circuit) may simultaneously realize functions and processes related to a plurality of components.

Each component, individually or as a whole, may be implemented in a computer consisting of one or more processors, logic circuits, memory, input/output interfaces, computer-readable recording media, and the like. In that case, the various functions and processes described above may be realized by recording a program for realizing each component or the entire function on a recording medium, loading the recorded program into a computer system, and executing the program.

In this case, for example, the processor is at least one of a CPU, a DSP (Digital Signal Processor), and a GPU (Graphics Processing Part). For example, the logic circuit is at least one of ASIC (Application Specific Integrated Circuit) and FPGA (Field-Programmable Gate Array).

Further, the "computer system" referred to here may include hardware such as an OS and peripheral devices. Further, the "computer system" includes a homepage providing environment (or a display environment) if a WWW system is used. The "computer-readable recording medium" refers to a writable non-volatile memory such as a flexible disk, a magneto-optical disk, a ROM, a writable non-volatile memory such as a flash memory, a portable medium such as a CD-ROM, and a storage device such as a hard disk built in a computer system.

Further, the "computer-readable recording medium" also includes those that hold the program for a certain period of time, such as a volatile memory (for example, DRAM (Dynamic Random Access Memory)) inside a computer system that serves as a server or client when a program is transmitted via a network such as the Internet or a communication line such as a telephone line.

Further, the program may be transmitted from a computer system in which this program is stored in a storage device or the like to another computer system via a transmission medium or by a transmission wave in the transmission medium. Here, the "transmission medium" for transmitting a program refers to a medium having a function of transmitting information, such as a network (communication network) such as the Internet or a communication line (communication line) such as a telephone line. Further, the above program may be for realizing a part of the above-mentioned functions. Further, it may be a so-called difference file (difference program) that realizes the above-mentioned function in combination with a program already recorded in the computer system.

In the present specification, terms indicating directions such as "front, back, top, bottom, right, left, vertical, horizontal, vertical, horizontal, row and column" are used to describe these directions in the device of the present invention. Therefore, these terms used to describe the specification of the present invention should be interpreted relative to each other in the device of the present invention.

The present invention can be widely applied to any device having a circuit that operates in synchronization with a synchronization signal, and the power supply fluctuation can be moderated by operating the arithmetic circuit in a dummy manner (dummy operation) before and after the normal operation period.

What is claimed is:

1. An image processing device comprising:
   a circuit block in which an operation period is predetermined and intermittent operation is performed according to the operation period;
   a plurality of SRAMs; and
   a dummy control circuit configured to increase an intensity of a dummy operation of an unused SRAM among the plurality of SRAMs for a certain period of time before the operation period of the circuit block, and to decrease the intensity of the dummy operation of the unused SRAM among the plurality of SRAMs for a certain period of time after the operation period of the circuit block.

2. The image processing device according to claim 1, further comprising:
   an imaging element;
   and an imaging interface part configured to read out image data from the imaging element and to generate an imaging signal,
   wherein the circuit block is an imaging processing part that reads out the imaging signal from the imaging interface part to perform image processing, and
   the dummy control circuit causes an unused SRAM among the SRAMs to perform the dummy operation in a horizontal blanking period or a vertical blanking period before or after a control area of a control signal of the imaging element.

3. The image processing device according to claim 1, further comprising a mode switching circuit configured to change a timing of causing the SRAM to perform the dummy operation.

4. The image processing device according to claim 1, further comprising an intensity switching circuit configured to switch the intensity of the dummy operation by changing the number of SRAMs in which the dummy operation is performed or a control signal of the SRAM.

* * * * *